United States Patent [19]

Mukai

[11] Patent Number: 5,110,759
[45] Date of Patent: May 5, 1992

[54] CONDUCTIVE PLUG FORMING METHOD USING LASER PLANARIZATION

[75] Inventor: Ryoichi Mukai, Kawasaki, Japan

[73] Assignee: Fujitsu Limited, Kawasaki, Japan

[21] Appl. No.: 737,910

[22] Filed: Jul. 26, 1991

Related U.S. Application Data

[63] Continuation of Ser. No. 452,495, Dec. 19, 1989, abandoned.

Foreign Application Priority Data

Dec. 20, 1988 [JP] Japan ................... 63-325059

[51] Int. Cl.$^5$ ........................... H01L 21/268
[52] U.S. Cl. ................... 437/173; 437/187; 437/198
[58] Field of Search ............ 437/173, 198, 187

[56] References Cited

U.S. PATENT DOCUMENTS

| 4,674,176 | 6/1987 | Tuckerman | 437/189 |
| 4,758,533 | 7/1988 | Magee et al. | 437/173 |
| 4,800,179 | 1/1989 | Mukai | 437/173 |
| 4,920,070 | 4/1990 | Mukai | 437/194 |

FOREIGN PATENT DOCUMENTS

| 55-061038 | 5/1980 | Japan | 437/198 |
| 61-093650 | 5/1986 | Japan | . |
| 62-293739 | 12/1987 | Japan | 437/173 |
| 63-316456 | 12/1988 | Japan | . |
| 2-170420 | 7/1990 | Japan | 437/173 |

OTHER PUBLICATIONS

D. B. Tuckerman et al., "Laser Planarization", *Solid State Technology*, vol. 29, No. 4, Apr. 1986, pp. 129-134.

Primary Examiner—Brian E. Hearn
Assistant Examiner—Laura M. Holtzman
Attorney, Agent, or Firm—Staas & Halsey

[57] ABSTRACT

In a conductive plug forming method, a conductor layer is formed on the main surface of an insulator layer, only in the vicinity of a plurality of adjacent via holes in which plugs are to be formed, the conductor layer having a periphery defining a boundary encompassing the plurality of adjacent via holes. The volume of the material of the conductor layer within the boundary is of a predetermined amount, ranging from a minimum volume approximately equal to, to a maximum volume approximately equal to two times the total interior volume of the via holes. An energy beam is irradiated on the conductor layer to melt the conductor layer, so that the melted conductor material of the conductor layer flows toward and into the via holes, thereby forming a conductive plug in each of the via holes and without leaving any conductor layer material on the main surface of the substrate. The plurality of adjacent via holes may include at least first and second via holes of the same or different volume, and which may have the same or different depths in the insulator layer and/or areas in the plane of the main surface of the insulator layer. Multiple layer structures are disclosed which provide multiple layer interconnects and also include selectively positioned, reflective and/or energy absorptive layers for facilitating and selectively controlling the melting of the conductor layer while protecting other layers exposed to and irradiated by and/or otherwise heated by the irradiating energy beam.

28 Claims, 9 Drawing Sheets

CONDUCTIVE PLUG FORMING METHOD USING LASER PLANARIZATION

This application is a continuation-in-part of application Ser. No. 07/452,495, filed Dec. 19, 1989, now abandoned.

BACKGROUND OF THE INVENTION

The present invention generally relates to conductive plug forming methods, and more particularly to a conductive plug forming method in which a plug is formed in a via hole by applying an energy beam to melt a metal layer which is deposited in the vicinity of the via hole.

When a metal layer for interconnection is deposited on a surface which is not perfectly planar by a vapor deposition or a sputtering process, it is known that the step coverage of the metal layer is generally poor. The deposition of the metal layer is poor especially at an inner surface of a via hole such as a contact hole and a through hole. As the integration density of semiconductor devices increases and the device count per chip increases, the interconnection become extremely fine and the via hole also becomes extremely fine. As a result, it becomes more and more difficult to ensure positive deposition of the metal, and it is extremely difficult to form a satisfactory interconnection by simply depositing the metal layer by the vapor deposition or sputtering processes.

On the other hand, there is a method of irradiating a pulse laser beam on the metal layer to carry out a planarization process step. The inside of the via, hole is filled by the metal by this planarization step, but it is difficult to control the thickness of the metal layer and keep it uniform when the metal layer is not perfectly planar. For this reason, inconveniences are introduced when the metal layer is etched in a latter process.

Accordingly, a method of filling a metal inside the via hole before depositing a metal layer thereon was proposed in a Japanese Laid-Open Patent Application No.58-115835.

However, various kinds of via holes exist in semiconductor devices and the size and depth of these via holes are quite different depending on the use of the via holes. As a result, it is extremely difficult to satisfactorily fill the inside of each of the various kinds of via holes.

SUMMARY OF THE INVENTION

Accordingly, it is a general object of the present invention to provide a novel and useful conductive plug forming method in which the problems described above are eliminated.

Another and more specific object of the present invention is to provide a conductive plug forming method comprising the steps of forming a conductor layer only in the vicinity of each of a plurality of via holes which are formed in a substrate layer, and irradiating an energy beam on the conductor layer to melt the conductor layer so that the melted conductor material of the conductor layer completely fills the via holes, thereby forming a conductive plug in each of the via holes. According to the conductive plug forming method of the present invention, it is possible to form conductive plugs which completely fill the via holes. For this reason, an interconnection layer which is formed after the formation of the conductive plugs will be electrically connected to the conductive plugs, and the interconnection layer, can be formed to a uniform thickness so that it may be etched easily in a latter process.

Still another object of the present invention is to provide a conductive plug forming method comprising the steps of forming a conductor layer only in the vicinity of one or a plurality of via holes which are formed in a first layer which is formed on a second layer, and irradiating an energy beam on the conductor layer to melt the conductor layer so that a melted conductor material of the conductor layer completely fills the via holes thereby forming a conductive plug in each of the via holes. The first layer is substantially transparent with respect to the energy beam, and the conductor layer is made of a material having an absorption coefficient greater than that of the material constituting the second layer. According to the conductive plug forming method of the present invention, it is possible to prevent undesirable effects of the energy beam on the second layer, and it is thus possible to prevent damage and disconnection of an interconnection when the second layer is used as an interconnection layer.

A further object of the present invention is to provide a conductive plug forming method comprising the steps of forming a first conductor layer only in the vicinity of one or a plurality of via holes which are formed in a first layer which is formed on a second layer, forming a second conductor layer on the first conductor layer, and irradiating an energy beam on the second conductor layer to melt the first and second conductor layers so that the melted conductor materials of the first and second conductor layers completely fill the via holes, thereby forming a conductive plug in each of the via holes. The first layer is substantially transparent with respect to the energy beam, and the second conductor layer is made of a material having an absorption coefficient greater than that of the materials constituting the first conductor layer and the second layer. According to the conductive plug forming method of the present invention, it is possible to prevent undesirable effects of the energy beam on the second layer, and it is thus possible to prevent damage and disconnection of an interconnection when the second layer is used as an interconnection layer.

Another object of the present invention is to provide a conductive plug forming method comprising the steps of forming a conductor layer only in the vicinity of each of a plurality of via holes which are formed in an insulator layer and a reflection layer which is formed on the insulator layer, and irradiating an energy beam on the conductor layer to the conductor layer so that the melted conductor material of the conductor layer completely fills the via holes, thereby forming a conductive plug in each of the via holes. The insulator layer is substantially transparent with respect to the energy beam, and the reflection layer is made of a material having a reflectivity greater than that of the insulator layer. According to the conductive plug forming method of the present invention, it is possible to prevent undesirable effects of the energy beam on a layer which is provided below the insulator layer, and it is thus possible to prevent damage and disconnection of an interconnection when the layer is used as an interconnection layer.

Still another object of the present invention is to provide a conductive plug forming method comprising the steps of forming a conductor layer only in the vicinity of each of a plurality of via holes which are formed in an insulator layer, forming an absorption layer over the conductor layer and the insulator layer, and irradiating an energy beam on the conductor layer to melt the conductor layer so that a melted conductor material of the conductor layer completely fills the via holes, thereby forming a conductive plug in each of the via holes. The insulator layer is substantially transparent with respect to the energy beam, and the absorption layer is made of a material having a reflectivity smaller than that of the insulator layer and an absorption coefficient which is greater than that of the insulator layer. According to the conductive plug forming method of the present invention, it is possible to prevent undesirable effects of the energy beam on a layer which is provided below the insulator layer, and it is thus possible to prevent damage and disconnection of an interconnection when the layer is used as an interconnection layer.

Other objects and further features of the present invention will be apparent from the following detailed description when read in conjunction with the accompanying drawings.

DESCRIPTION OF THE PREFERRED EMBODIMENTS

First, a description will be given of a first embodiment of a conductive plug forming method according to the present invention, by referring to FIGS. 1, 2A, 2B, 3A, 3B, 4A and 4B. In this embodiment, plugs are formed in two via holes 10 and 12 shown in FIG. 1 which have identical sizes and depths. The via holes 10 and 12 each have a size of 2 $\mu$m $\times$ 2 $\mu$m and a depth of 1.5 $\mu$m. In this case, a total volume $V_0$ of the two via holes 10 and 12 can be described by the following.

$$V_0 = 2 \times (2 \times 2 \times 1.5) = 12 \ \mu m^3$$

Figure 1:
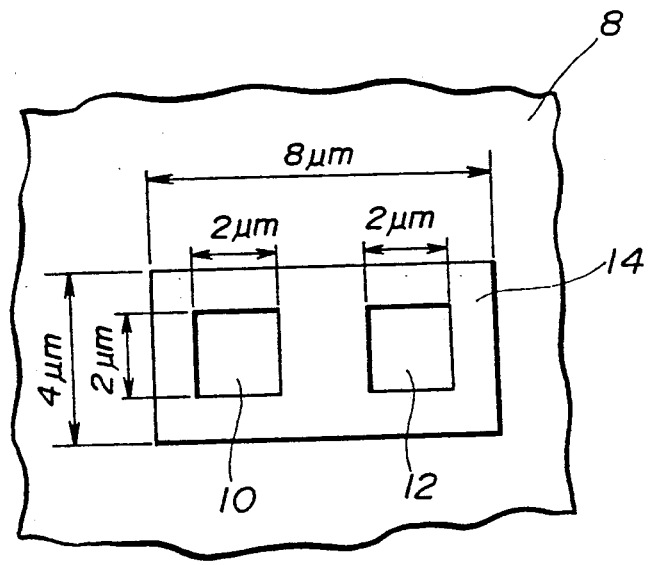
FIG. 1 is a plan view showing via holes in which plugs are formed by a first embodiment of a conductive plug forming method according to the present invention.

After a metal layer 14 is deposited on a substrate (or a layer) 8 in a rectangular shape of 4 $\mu$m $\times$ 8 $\mu$m as shown in FIG. 1, a laser beam is irradiated on the metal layer 14 as an energy beam under the following conditions.

Laser beam: XeCl excimer laser
Energy Density: 2.2 J/cm$^2$
Irradiation Frequency: 4 times
Substrate Heating Temperature: 300° C.
Ambient Condition During Irradiation: Vacuum ($4 \times 10^{-5}$ Torr)

By the irradiation of the laser beam, the metal layer 14 melts and flows into the via holes 10 and 12. As a result, plugs 16 and 18 are respectively formed inside the via holes 10 and 12.

Figure 2A:
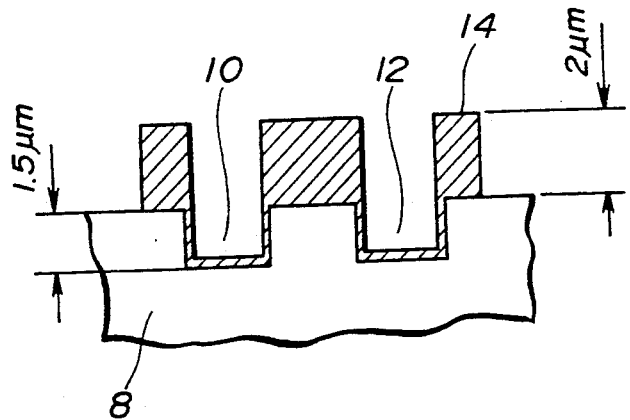
FIGS. 2A and 2B respectively are cross sectional views for explaining the first embodiment under a first condition.

FIG. 2A shows a case where the thickness of the metal layer 14 is set to 2 $\mu$m. Assuming that essentially no metal layer 14 is deposited initially in the via holes 10 and 12, a volume $V_m$ of the deposited metal layer 14 is described by the following.

$$\begin{aligned} V_m &= (4 \times 8 - 2 \times 2 \times 2) \times 2 \\ &= 48 \ \mu m^3 > 2V_0 \end{aligned}$$

Figure 2B:
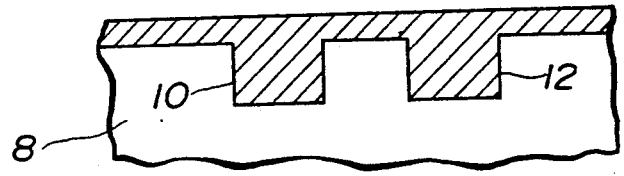

In this case, there is too much metal and no plugs are formed solely in the via holes 10 and 12 because the metal also flows to the periphery of the via holes 10 and 12 as shown in FIG. 2B.

Figure 3A:
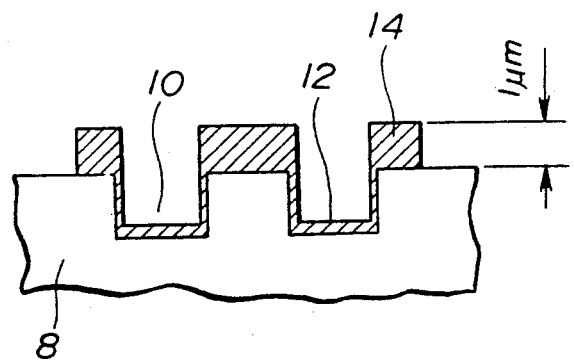
FIGS. 3A and 3B respectively are cross sectional views for explaining the first embodiment under a second condition.

FIG. 3A shows a case where the thickness of the metal layer 14 is set to 1 $\mu$m. Assuming that essentially no metal layer 14 is deposited initially in the via holes 10 and 12, a volume $V_m$ of the deposited metal layer 14 is described by the following.

$$\begin{aligned} V_m &= (4 \times 8 - 2 \times 2 \times 2) \times 1 \\ &= 24 \ \mu m^3 = 2V_0 \end{aligned}$$

Figure 3B:
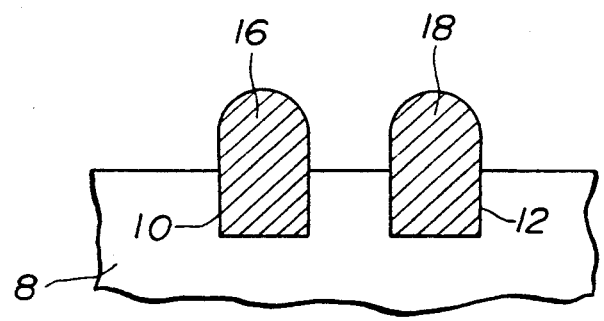

In this case, the plugs 16 and 18 are respectively formed in the via holes 10 and 12 and extend above the surface of substrate 8 but without any conductor material remaining on the substrate surface in the vicinity of (i.e., adjacent to and surrounding) the via holes as shown in FIG. 3B.

Figure 4A:
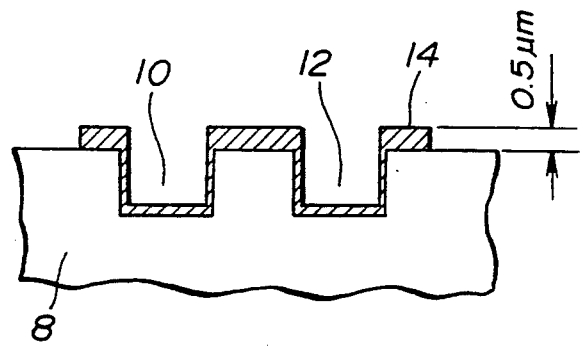
FIGS. 4A and 4B respectively are cross sectional views for explaining the first embodiment under a third condition.

FIG. 4A shows a case where the thickness of the metal layer 14 is set to 0.5 $\mu$m. Assuming that essentially no metal layer 14 is deposited initially in the via holes 10 and 12, a volume $V_m$ of the deposited metal layer 14 is described by the following.

$$\begin{aligned} V_m &= (4 \times 8 - 2 \times 2 \times 2) \times 0.5 \\ &= 12 \ \mu m^3 < 2V_0 \end{aligned}$$

Figure 4B:
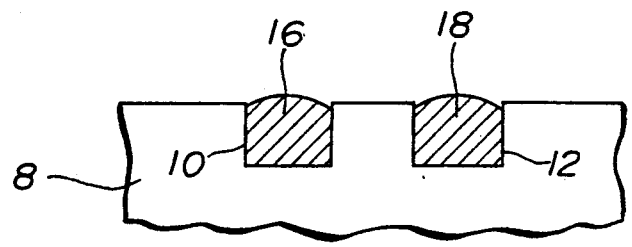

In this case, the plugs 16 and 18 are respectively formed in the via holes 10 and 12 as shown in FIG. 4B. The height of the plugs 16 and 18 formed in FIG. 4B is lower than that of the plugs 16 and 18 formed in FIG. 3B.

As may be seen from FIGS. 2A through 4B, satisfactory plugs 16 and 18 are respectively formed in the via holes 10 and 12 when the volume of the metal layer 14 in the vicinity of (i.e., surrounding) the adjacent via holes 10 and 12 is less than or equal to two times the total volume of the via holes 10 and 12 (i.e., two times the sum of the respective volumes of the via holes 10 and 12).

Although the area of the metal layer 14 is the same for each of the cases shown in FIGS. 2A, 3A and 4A, the area of the metal layer 14 may be made larger in each case as long as the melted metal flows into the via holes 10 and 12.

Next, descriptions will be given of embodiments of the conductive plug forming method according to the present invention where the volume of the via hole 10 is different from that of the via hole 12.

Figure 5A:
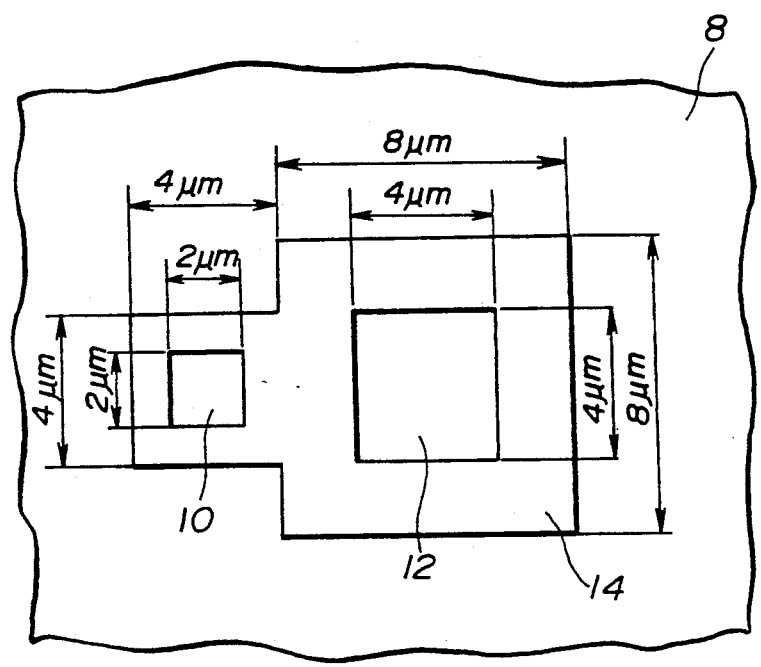
FIGS. 5A and 5B respectively are a plan view and a cross sectional view for explaining a second embodiment of the conductive plug forming method according to the present invention.
Figure 5B:
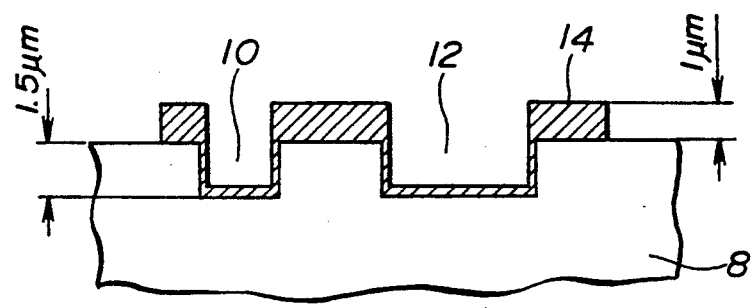

In a second embodiment, the volume of the via hole 10 is smaller than that of the via hole 12. In FIGS. 5A and 5B, the via hole 10 has a size of 2 $\mu m \times 2$ $\mu m$, and the via hole 12 has a size of 4 $\mu m \times 4$ $\mu m$. The via holes 10 and 12 have the same depth of 1.5 $\mu m$. In this case, a total volume $V_O$ of the two via holes 10 and 12 can be described by the following.

$$V_0 = 1.5 \times (2 \times 2 + 4 \times 4) = 30 \ \mu m^3$$

The metal layer 14 is deposited on the substrate (or the layer) 8 in a shape shown in FIG. 5A with an area of 60 $\mu m^2$ so that the volume of the metal layer 14 deposited in the vicinity of the via hole 12 is larger than that in the vicinity of the via hole 10. A laser beam is irradiated on the metal layer 14 as an energy beam under conditions similar to the first embodiment. By the irradiation of the laser beam, the metal layer 14 melts and flows into the via holes 10 and 12. As a result, plugs are respectively formed inside the via holes 10 and 12.

FIG. 5A shows a case where the thickness of the metal layer 14 is set to 1 $\mu m$. Assuming that essentially no metal layer 14 is deposited initially in the via holes 10 and 12, a volume $V_m$ of the deposited metal layer 14 is described by the following.

$$V_m = (4 \times 4 - 2 \times 2 + 8 \times 8 - 4 \times 4) \times 1$$
$$= 60 \ \mu m^3 = 2V_0$$

In this embodiment, it can be seen that satisfactory plugs are formed when the metal layer 14 is formed to a thickness of 1 $\mu m$ or less with an area of 60 $\mu m^2$ or less.

Figure 6A:
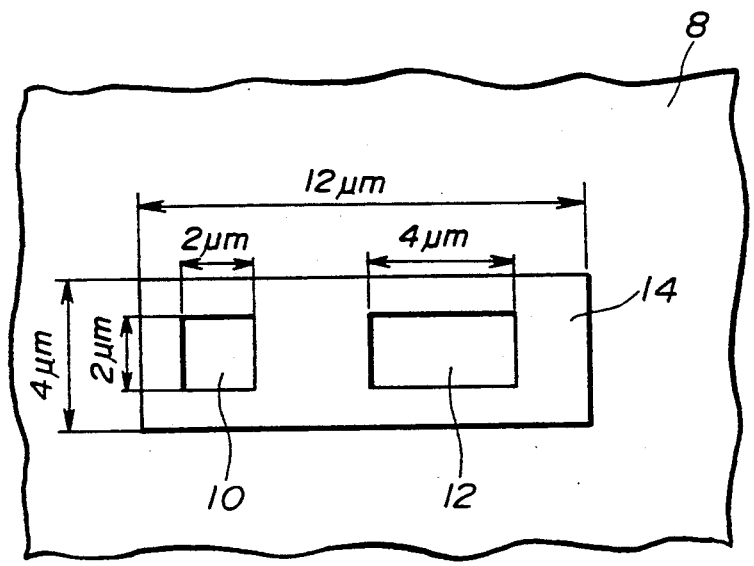
FIGS. 6A and 6B respectively are a plan view and a cross sectional view for explaining a third embodiment of the conductive plug forming method according to the present invention.
Figure 6B:
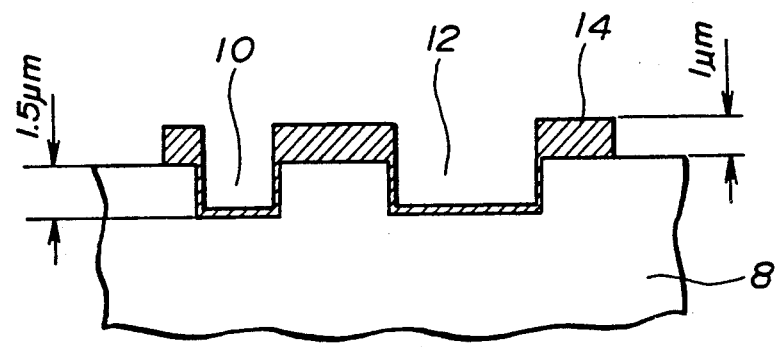

In a third embodiment, the volume of the via hole 10 is also smaller than that of the via hole 12. In FIGS. 6A and 6B, the via hole 10 has a size of 2 $\mu m \times 2$ $\mu m$, and the via hole 12 has a size of 2 $\mu m \times 4$ $\mu m$. The via holes 10 and 12 have the same depth of 1.5 $\mu m$. In this case, a total volume $V_0$ of the two via holes 10 and 12 can be described by the following.

$$V_0 = 1.5 \times (2 \times 2 + 2 \times 4) = 18 \ \mu m^3$$

The metal layer 14 is deposited on the substrate (or the layer) 8 in a rectangular shape shown in FIG. 6A with an area of 36 $\mu m^2$. A laser beam is irradiated on the metal layer 14 as an energy beam under conditions similar to the first embodiment. By the irradiation of the laser beam, the metal layer 14 melts and flows into the via holes 10 and 12. As a result, plugs are respectively formed inside the via holes 10 and 12.

FIG. 6A shows a case where the thickness of the metal layer 14 is set to 1 $\mu m$. Assuming that essentially no metal layer 14 is deposited initially in the via holes 10 and 12, a volume $V_m$ of the deposited metal layer 14 is described by the following.

$$V_m = (4 \times 12 - 2 \times 2 - 2 \times 4) \times 1$$
$$= 36 \ \mu m^3 = 2V_0$$

In this embodiment, it can be seen that satisfactory plugs are formed when the metal layer 14 is formed to a thickness of 1 $\mu m$ or less with an area of 36 $\mu m^2$ or less.

Figure 7A:
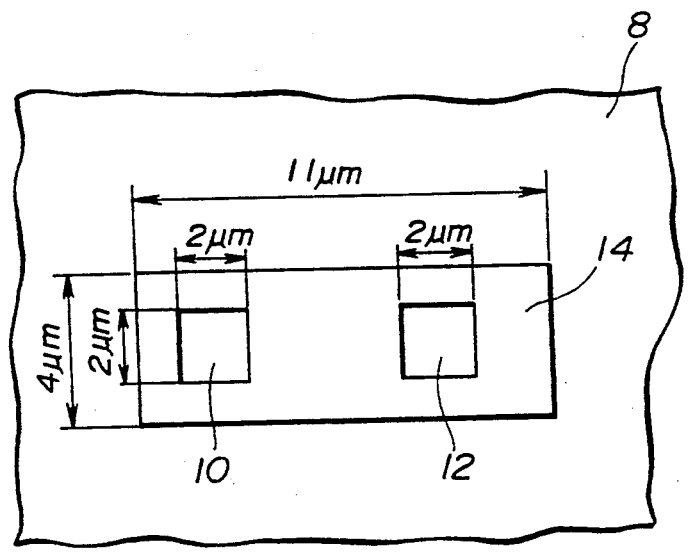
FIGS. 7A and 7B respectively are a plan view and a cross sectional view for explaining a fourth embodiment of the conductive plug forming method according to the present invention.
Figure 7B:
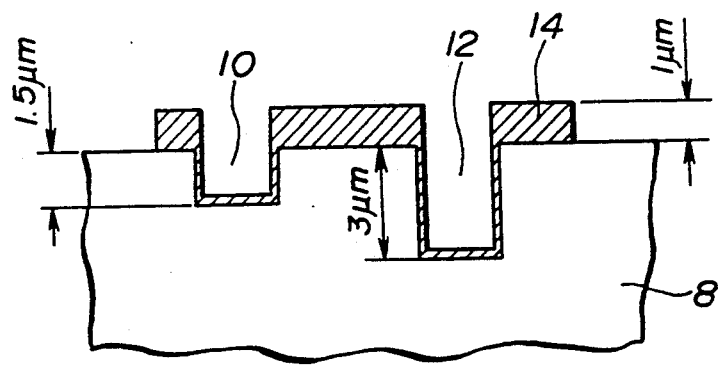

In a fourth embodiment, the volume of the via hole 10 is also smaller than that of the via hole 12. In FIGS. 7A and 7B, the via holes 10 and 12 respectively have a size of 2 $\mu m \times 2$ $\mu m$, but the via hole 10 has a depth of 1.5 $\mu m$ while the via hole 12 has a depth of 3 $\mu m$. In this case, a total volume $V_0$ of the two via holes 10 and 12 can be described by the following.

$$V_0 = (1.5 \times 2 \times 2 + 3 \times 2 \times 2) = 18 \ \mu m^3$$

The metal layer 14 is deposited on the substrate (or the layer) 8 in a rectangular shape shown in FIG. 7A with an area of 36 $\mu m^2$. A laser beam is irradiated on the metal layer 14 as an energy beam under conditions similar to the first embodiment. By the irradiation of the laser beam, the metal layer 14 melts and flows into the via holes 10 and 12. As a result, plugs are respectively formed inside the via holes 10 and 12.

FIG. 7A shows a case where the thickness of the metal layer 14 is set to 1 $\mu m$. Assuming that essentially no metal layer 14 is deposited initially in the via holes 10 and 12, a volume $V_m$ of the deposited metal layer 14 is described by the following.

$$V_m = (4 \times 11 - 2 \times 2 - 2 \times 2) \times 1$$
$$= 36 \ \mu m^3 = 2V_0$$

In this embodiment, it can be seen that satisfactory plugs are formed when the metal layer 14 is formed to a thickness of 1 $\mu m$ or less with an area of 36 $\mu m^2$ or less.

Accordingly, by setting the area and thickness of the metal layer so that the volume of the metal layer in the vicinity of two adjacent via holes is less than or equal to two times the total volume of the via holes, it becomes unnecessary to independently form a metal layer for each via hole and it is sufficient to form one metal layer which covers a plurality of via holes.

Of course, the number of via holes is not limited to two and the via holes may have shapes different from those of the first through fourth embodiments. For example, the metal layer may be made of aluminum (Al), metals other than Al, or an alloy which includes selected metals such as Al. In addition, the metal layer may be replaced by any suitable conductor layer.

In FIGS. 2A through 7B, the illustration of a conductor layer such as an interconnection layer which makes contact with the plugs is omitted for the sake of convenience. But in actual practice, an interconnection layer makes contact with the two plugs in FIGS. 3B, 4B, 5B and 6B, and first and second interconnection layers of a multi-level interconnection respectively make contact with the two plugs of different depths in FIG. 7B.

Depending on the configuration of the semiconductor device, the semiconductor device may have a multi-level interconnection. For example, a first interconnection layer is formed on a substrate (or an insulator layer), a second interconnection layer is formed on an interlayer insulator layer which is formed on the first interconnection layer, and the first and second interconnection layers are connected via a via hole. But when forming a plug within the via hole prior to forming the second interconnection layer, a portion of the interlayer insulator layer, other than in the vicinity of the via hole, is directly subjected to the pulse laser beam when melting a metal layer which is formed in the vicinity of the via hole as in the case of the above described embodiments.

Normally, the interlayer insulator layer is made of a phospho-silicate glass (PSG), silicon dioxide ($SiO_2$) or the like which is transparent with respect to the pulse laser beam. For this reason, when the pulse laser beam is irradiated on the interlayer insulator layer, the pulse laser beam is irradiated on the first interconnection layer below the interlayer insulator layer and melts the first interconnection layer. When the first interconnection layer melts, there are problems in that the pattern of the first interconnection layer becomes damaged and disconnected.

Next, descriptions will be given of embodiments of the conductive plug forming method according to the present invention in which these problems can be overcome.

In a fifth embodiment of the conductive plug forming method according to the present invention, a metal layer, which is formed on an interlayer insulator layer in the vicinity of a via hole similarly to the first through fourth embodiments is made of a material which melts at a pulse laser energy density lower than that of a material which is used to form an interconnection layer below the interlayer insulator layer. According to this embodiment, it is possible to prevent the interconnection layer below the interlayer insulator layer from melting when forming a plug inside the via hole.

Figure 8A:
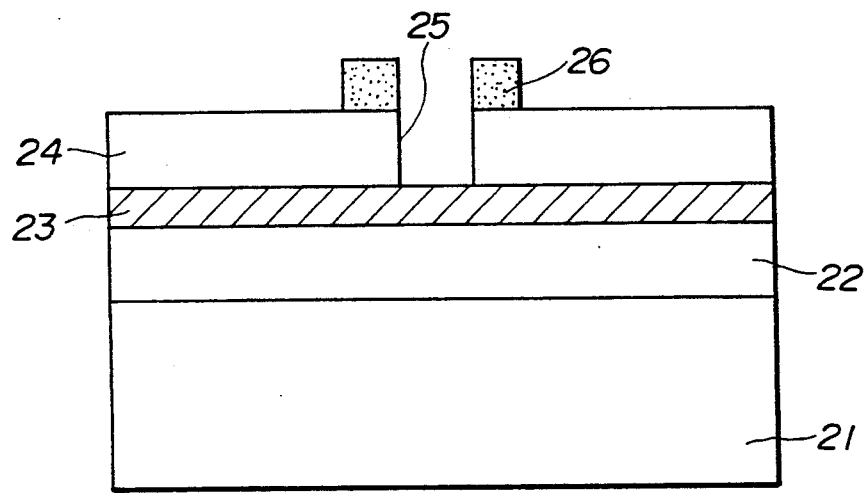
FIGS. 8A and 8B are cross sectional views for explaining a fifth embodiment of the conductive plug forming method according to the present invention.

In FIG. 8A, a $SiO_2$ layer 22 is formed on a Si substrate 21, and a first interconnection layer 23 is formed on the $SiO_2$ layer 22. In this embodiment, the $SiO_2$ layer 22 has a thickness of 0.8 $\mu$m, and the first interconnection layer 23 is made of Al and has a thickness of 0.5 $\mu$m. An interlayer insulator layer 24 is formed on the first interconnection layer 23, and a via hole 25 is formed in the interlayer insulator layer 24. For example, the interlayer insulator layer 24 is made of PSG and has a thickness of 0.5 $\mu$m. A metal layer 26 is formed on the interlayer insulator layer 24 in a vicinity of the via hole 25. This metal layer 26 is made of copper (Cu) and has a thickness of 0.6 $\mu$m. The metal layer 26 is formed similarly to the first through fourth embodiments so that the melted metal flows into the via hole 25 when the pulse laser beam is irradiated on the metal layer 26.

The absorption coefficient of Cu is approximately $0.9 \times 10^6$/cm for optical wavelengths of 190 nm to 350 nm, while the absorption coefficient of Al is approximately $1.3 \times 10^6$/cm for the same optical wavelengths. Hence, the absorption coefficients of Cu and Al are approximately the same, and 80% or more of the incident light is absorbed to a depth of approximately 10 nm from the surface in each of the Cu layer and Al layer. On the other hand, the reflectivity of Cu is approximately 20% while, the reflectivity of Al is 90% or more. As a result, the irradiated pulse laser beam is absorbed approximately 70% more in the Cu layer than in the Al layer, and the Cu layer is heated by this absorption. Although the melting point of Cu is 1084° C. which is higher than that of Al which is 660° C., the Cu layer can be melted at a pulse laser energy density which is lower than that required to melt the Al layer. When the XeCl excimer laser is used, it requires a pulse laser energy density of 6 $J/cm^2$ to melt Al but the Cu can be melted at a low pulse laser energy density of 2 $J/cm^2$.

Figure 8B:
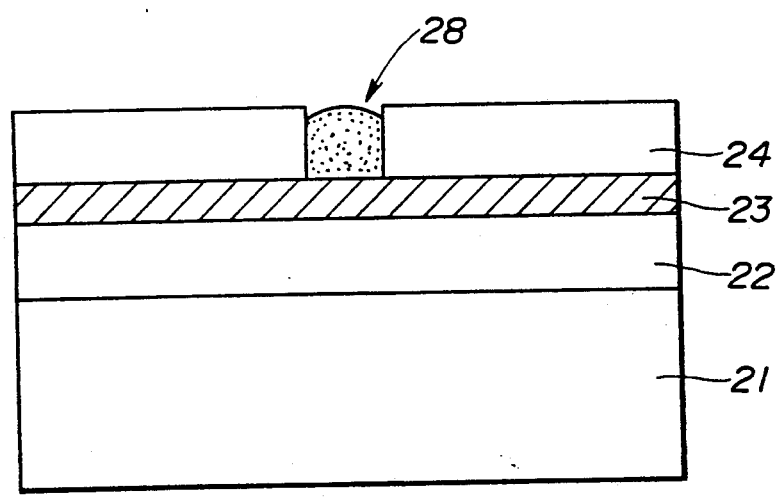

Therefore, a plug 28 can be formed in the via hole 25 as shown in FIG. 8B by simply melting the metal (Cu) layer 26 at the pulse laser energy density of 2 $J/cm^2$. Although the pulse laser beam is irradiated on the interconnection layer 23 through the interlayer insulator layer 24 which is transparent with respect to the pulse laser beam, the pulse laser energy density is sufficiently low such that the melting of the interconnection layer 23 is prevented. Hence, there is no danger of the interconnection layer 23 being damaged and disconnected by the irradiation of the pulse laser beam.

In a sixth embodiment of the conductive plug forming method according to the present invention, a metal layer which is formed on an interlayer insulator layer in a vicinity of a via hole similarly to the first through fourth embodiments has a 2-layer stacked structure. The 2-layer stacked structure comprises a first metal layer which is formed on the interlayer insulator layer, and a second metal layer which is formed on the first metal layer. The second metal layer is made of a material which melts at a pulse laser energy density lower than that of a material which constitutes the first metal layer and lower than that of a material which is used to form an interconnection layer below the interlayer insulator layer. According to this embodiment, it is possible to prevent the interconnection layer below the interlayer insulator layer from melting when forming a plug inside the via hole.

Figure 9A:
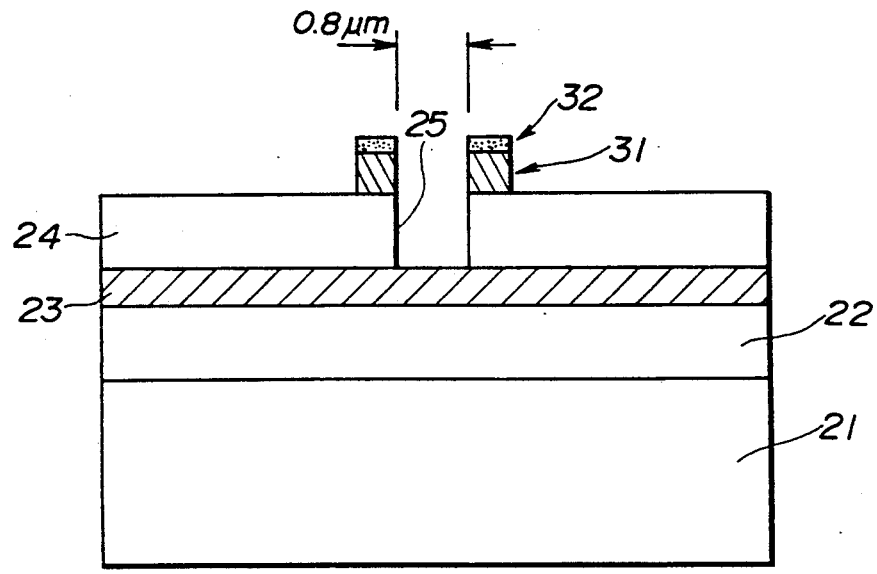
FIGS. 9A and 9B are cross sectional views for explaining a sixth embodiment of the conductive plug forming method according to the present invention.
Figure 9B:
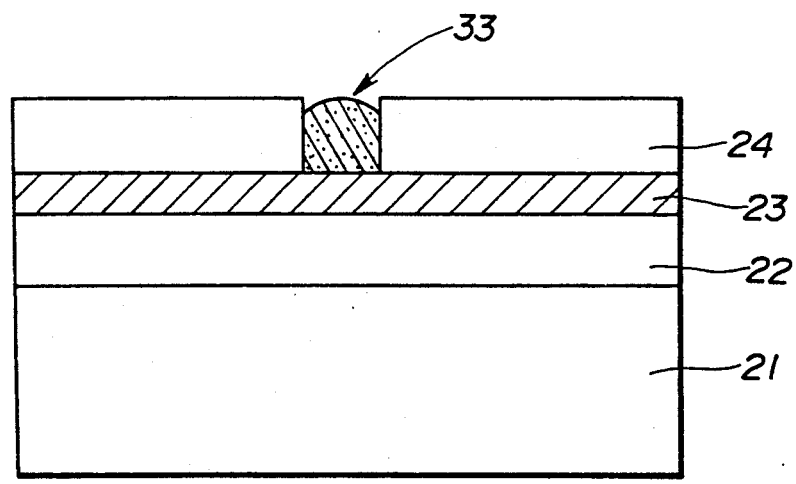

In FIGS. 9A and 9B, those parts which are essentially the same as those corresponding parts in FIGS. 8A and 8B are designated by the same reference numerals, and a description thereof will be omitted. In FIG. 9A, an Al layer 31 is formed on the interlayer insulator layer 24 in the vicinity of the via hole 25, and a Cu layer 32 is formed on the Al layer 31. For example, the Al layer 31 has a thickness of 0.5 $\mu$m, the Cu layer 32 has a thickness of 100 Å, and the via hole 25 has a diameter of 0.8 $\mu$m. When the pulse laser beam is applied on the Cu layer 32, approximately 20% of the pulse laser beam is reflected but the remaining 80% is absorbed in the Cu layer 32. The Cu layer 32 is thus heated, and this heat is transmitted to the Al layer 31 and melts the Al layer 31. As a result, a plug 33 which is made of an alloy of Cu and Al is formed in the via hole 25 as shown in FIG. 9B. Because the pulse laser energy density required to melt the Cu layer 32 is only 2 $J/cm^2$, it is possible to prevent the melting of the interconnection layer 23.

In the fifth and sixth embodiments, only one via hole is shown for the sake of convenience. However, it is of course possible to apply these embodiments to cases where two or more via holes are provided in the semiconductor device. In addition, it is possible to use titanium (Ti) in place of Cu. Furthermore, if the interconnection layer immediately below the interlayer insulator layer is made of silicide, silicon or the like, it is possible to use Al in place of Cu (Ti) for the second metal layer which is formed in the vicinity of the via hole.

Of course, the metal layer in the fifth and sixth embodiments can be replaced by any suitable conductor layer.

Depending on the material used for the metal layer which is formed in the vicinity of the via hole and also depending on the configuration of the semiconductor device said the material used for the interconnection layer below the interlayer insulator layer, it may be inevitable to melt the metal layer at a relatively high pulse laser energy density. In this case, there is a problem in that the layer below the interlayer insulator layer such as the interconnection layer becomes damaged by the pulse laser beam.

Next, descriptions will be given of embodiments of the conductive plug forming method according to the present invention in which this problem is overcome.

Figure 10C:
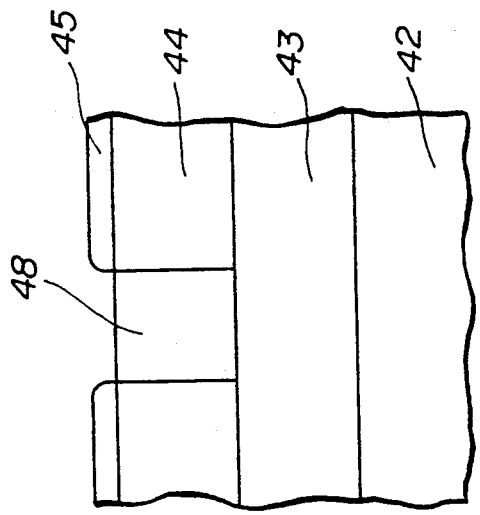
FIGS. 10A through 10C are cross sectional views for explaining a seventh embodiment of the conductive plug forming method according to the present invention.

In a seventh embodiment of the conductive plug forming method according to the present invention, a reflection layer is formed on the interlayer insulator layer so as to prevent the pulse laser beam from transmitting through the interlayer insulator layer when forming the plug. In FIG. 10A, an Al interconnection layer 43 is formed on a base layer 42, and a PSG interlayer insulator layer 44 is formed on the Al interconnection layer 43. A reflection layer 45 is formed on the PSG interlayer insulator layer 44, and an aluminum-silicon (Al-Si) metal layer 46 is formed on the reflection layer 45. For example, the reflection layer 45 is made of iridium (Ir) or rhodium (Rh). In this embodiment, the PSG interlayer insulator layer 44 has a thickness of 1 $\mu$m, the reflection layer 45 has a thickness of 10 nm, and the Al-Si metal layer 46 has a thickness of 1 $\mu$m.

Figure 10B:
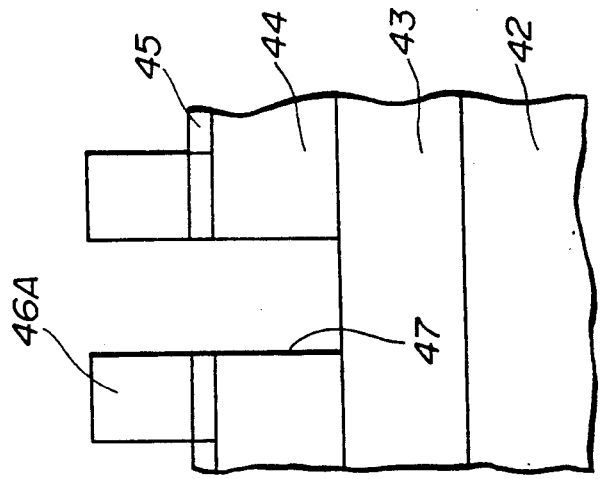
Figure 10A:
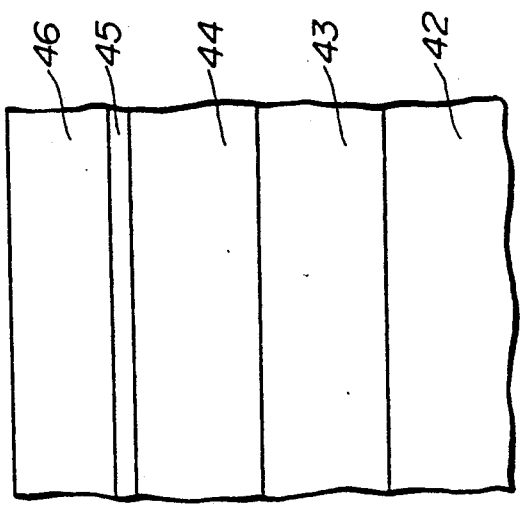

A patterning step is carried out to form a via hole 47 and an etching step is performed so that a metal layer 46A remains only in the vicinity of the via hole 47 as shown in FIG. 10B. The via hole 47 penetrates the layers 45 and 44 and exposes the corresponding surface of the Al interconnection layer 43.

Then an XeCl system excimer laser beam having a wavelength of 308 nm is irradiated on the entire surface portion of the structure shown in FIG. 10B. By this laser beam irradiation, the metal layer 46A is melted and flows into the via hole 47 to form a plug 48 as shown in FIG. 10C. Since the reflection layer 45 has a high reflectivity with respect to the XeCl system excimer laser beam and also has a high melting point, the metal layer 46A can be melted satisfactorily into the via hole 47 without the danger of the laser beam damaging the Al interconnection layer 43 through the PSG interlayer insulator layer 44. With respect to the XeCl system excimer laser beam having the wavelength of 308 nm, Ir has a reflectivity of approximately 80% and a melting point of 2454° C., and Rh has a reflectivity of approximately 70% and a melting point of 1966° C.

Figure 11A:
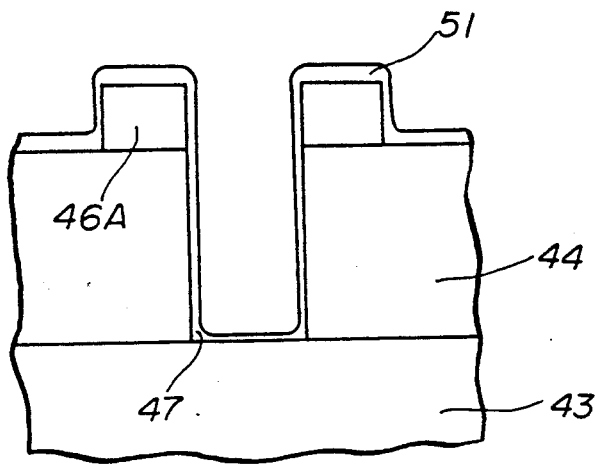
FIGS. 11A and 11B are cross sectional views for explaining an eighth embodiment of the conductive plug forming method according to the present invention.
Figure 11B:
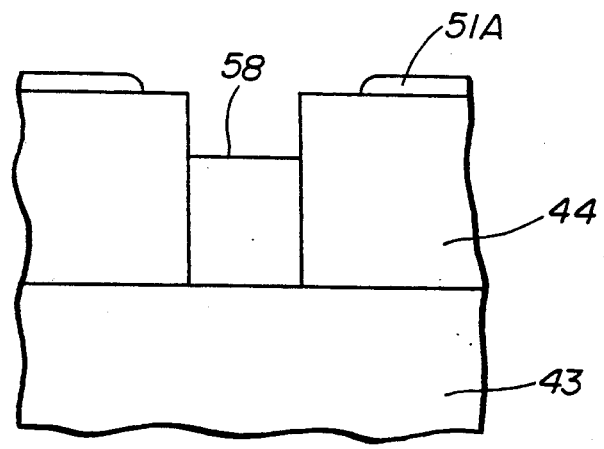

In an eighth embodiment of the conductive plug forming method according to the present invention, an absorption layer is formed on the interlayer insulator layer so as to prevent the pulse laser beam from transmitting through the interlayer insulator layer when forming the plug. In FIGS. 11A and 11B, those parts which are essentially the same as those corresponding parts in FIGS. 10A through 10C are designated by the same reference numerals, and a description thereof will be omitted.

In FIG. 11A, an absorption layer 51 is formed on the entire surface portion of the structure which is basically the same as that shown in FIG. 10B except that no reflection layer is provided in FIG. 11A. In this embodiment, the Al interconnection layer 43 has a thickness of 1 $\mu$m, the PSG interlayer insulator layer 44 has a thickness of 1 $\mu$m, and the absorption layer 51 is made of polysilicon and has a thickness of 50 nm. Polysilicon has a reflectivity of approximately 40% with respect to ArF system excimer laser beam. Hence, when the ArF system excimer laser beam is irradiated on the entire surface portion of the structure shown in FIG. 11A, the Al metal layer 46A in the vicinity of the via hole 47 melts and flows into the via hole 47 to form a plug 58 as shown in FIG. 11B. A polysilicon absorption layer 51A remains on the PSG interlayer insulator layer 44 at a portion other than the vicinity of the via hole 47. Because the melting point of PSG is higher than that of Al, the PSG interlayer insulator layer 44 will not melt by the heat which is absorbed by the absorption layer 51 (51A) and there is no danger of the interconnection layer 43 becoming damaged and disconnected.

In the seventh and eighth embodiments, only one via hole is shown for the sake of convenience. However, it is of course possible to apply these embodiments to cases where two or more via holes are provided in the semiconductor device. In addition, the materials used for the reflection layer and the absorption layer are not limited to those of the seventh and eighth embodiments. Of course, the layer immediately below the interlayer insulator layer is not limited to the interconnection layer. The purpose of providing the reflection layer in the seventh embodiment and the absorption layer in the eighth embodiment is to prevent damage to the layer below the interlayer insulator layer when forming the plug. Moreover, the metal layer may be replaced by any suitable conductor layer.

In addition, in each of the described embodiments, the via holes may have arbitrary shapes.

Further, the present invention is not limited to these embodiments, but various variations and modifications may be made without departing from the scope of the present invention.

What is claimed is:

1. A conductive plug forming method for forming conductive plugs in via holes of an insulating layer having a main surface, comprising the steps of;

providing an insulator layer having a plurality of via holes extending thereinto from said main surface, each via hole being separated relatively to another via hole of the plurality thereof by a respective, intervening portion of said main surface;

forming a conductor layer on the main surface of the insulator layer, only in the vicinity of said plurality of via holes including each said intervening portion, the periphery of said conductor layer defining a boundary encompassing therewithin said plurality of via holes and the total volume of conductor material of the conductor layer being determined in accordance with the total of the respective, individual volumes of the plurality of via holes encompassed within the boundary; and melting the conductor layer by irradiating said conductor layer with an energy beam, the conductor layer having a predetermined volume of conductor material within said boundary relative to the total volume of said plurality of adjacent via holes such that, when melted, the volume of conductor material within said boundary thereof and in the vicinity of said plurality of adjacent via holes flows in its entirety from said main surface of said insulator layer, toward and into said plurality of via holes within said boundary, and forms respective plugs in said plurality of via holes and none of said conductor material of said conductor layer remains on said main surface.

2. The conductive plug forming method of claim 1, wherein the predetermined volume of the conductor layer material is selected to be within the range of from a minimum volume approximately equal to, up to a maximum volume of two times, the total volume of said plurality of via holes encompassed within the boundary of said conductor layer.

3. The conductive plug forming method of claim 1, wherein:
said plurality of adjacent via holes comprises at least first and second adjacent via holes having a common depth but having respective, different areas in the plane of said main surface of said insulator layer and correspondingly having respective, different individual volumes; and
said conductor layer is formed so as to have a periphery defining an approximately rectangular boundary encompassing therewithin said plurality of via holes.

4. The conductive plug forming method of claim 1, wherein:
said plurality of adjacent via holes comprises at least first and second via holes having respective, different areas in the plane of said main surface of said insulator layer and a common depth and correspondingly having respective, first and second different volumes; and
said conductor layer is formed so as to have a periphery defining a boundary of at least first and second portions of respective, at least first and second different dimensions in the vicinity of said respective, at least first and second via holes and, correspondingly, so as to have at least first and second, different conductor material volume portions approximately in proportion to said first and second volumes of, and in the corresponding vicinities of, said respective, at least first and second via holes.

5. The conductive plug forming method of claim 1, wherein:
said plurality of adjacent via holes comprise at least first and second via holes having respective, first and second different volumes; and
said conductor layer is formed so as to have a periphery defining a boundary of at least first and second portions of respective, at least first and second different conductive material volume portions approximately in proportion to the respective at least said first and second different volumes of, and in the corresponding vicinities of, said respective at least first and second via holes.

6. The conductive plug forming method of claim 5, wherein said at least first and second adjacent via holes have different areas in the plane of said main surface of said insulating layer but extend to a common depth therein.

7. The conductive plug forming method of claim 5, wherein said at least first and second via holes have a common area in the plane of said main surface of said insulator layer but extend to respective, different depths therein.

8. The conductive plug forming method of claim 1, wherein:
said insulator layer is made of a material selected from the group consisting of phosphosilicate glass (PSG) and silicon dioxide ($SiO_2$); and
said conductor layer is made of a material selected from the group consisting of aluminum (Al), copper (Cu) and titanium (Ti).

9. The conductive plug forming method of claim 1, wherein said step of melting the conductor layer is performed by irradiating the conductor layer with a pulse laser beam.

10. The conductive plug forming method of claim 1, further comprising:
providing said insulator layer as a first layer of a first material, which is substantially transparent to the energy beam, on a second layer of a second, different material;
forming said conductor layer of a material having an absorption coefficient greater than that of said second material of said second layer; and
said step of melting the conductor layer is performed by irradiating the conductor layer with a pulse laser beam.

11. The conductive plug forming method of claim 10, wherein:
said first, insulator layer is made of a material selected from the group consisting of phosphosilicate glass (PSG) and silicon dioxide ($SiO_2$);
said second layer is made of a material selected from the group consisting of aluminum (Al), silicides and silicon; and
said conductor layer is made of a material selected from the group consisting of aluminum (Al), copper (Cu) and titanium (Ti).

12. The conductive plug forming method of claim 1, further comprising:
providing the insulator layer as a first layer of a first material, which is substantially transparent to the energy beam, on a second layer of a second material different from said first material;
forming said conductor layer as first and second component conductor layers of first and second, different conductor materials and having identical configurations and thereby having a common boundary, said second component conductor layer completely covering the surface of said first component conductor layer and said second conductor material having an absorption coefficient greater than that of said first conductor material and of said second insulator layer material, the total volume of the respective first and second conductor materials of said first and second conductor layers being selected to be within the range of from a minimum volume approximately equal to, up to a maximum volume approximately two times the total volume of said plurality of via holes encompassed within the common boundary of said first and second component conductor layers; and
said step of melting said conductor layer comprises irradiating the second component conductor layer with a pulse laser beam.

13. The conductive plug forming method of claim 12, wherein:
said first material of said first, insulator layer is selected from the group consisting of phosphosilicate glass (PSG) and silicon dioxide ($SiO_2$);
said second material of said second layer is aluminum (Al);
said first conductor material is aluminum (Al); and said second conductor material is selected from the group consisting of copper (Cu) and titanium (Ti).

14. The conductive plug forming method of claim 1, further comprising:
providing a reflection layer on the main surface of said insulator layer, said plurality of adjacent via holes extending through the reflection layer; and
said insulator layer being formed of a material which is substantially transparent with respect to the energy beam and said reflection layer being formed of a material which has a reflectivity greater than that of said insulator layer.

15. The conductive plug forming method of claim 1, further comprising:
forming an energy beam absorption layer on the conductor layer and on the exposed portions of the main surface of said insulator layer, said insulator layer being made of a material which is substantially transparent with respect to the energy beam and said energy beam absorption layer being made of a material which has a reflectivity smaller than that of said insulator layer material and an absorption coefficient which is greater than that of said insulator layer material; and
melting the conductor layer by irradiating the energy beam absorption layer with a pulse laser beam.

16. The conductive plug forming method of claim 15, wherein:
said insulator layer material is selected from the group consisting of phosphosilicate glass (PSG) and silicon dioxide ($SiO_2$);
said absorption layer material is aluminum (Al); and
said conductor layer material is aluminum (Al).

17. The conductive plug forming method of claim 16, further comprising providing an aluminum interconnection layer on which said insulator layer is formed.

18. The conductive plug forming method of claim 15, wherein said insulator layer material has a higher melting point than that of said conductor layer material.

19. The conductive plug forming method of claim 1, wherein said at least first and second adjacent via holes have common, respective first and second width dimensions and are spaced apart by a minimum distance approximately equal to said common width dimension and by a maximum distance approximately equal to twice said common width dimension.

20. The conductive plug forming method of claim 1, wherein said at least first and second via holes have respective first and second width dimensions, said first width dimension being smaller than said second width dimension, and said predetermined distance is approximately the average of the said at least first and second width dimensions.

21. A method as recited in claim 1, wherein the step of forming the conductor layer comprises proportioning the total volume of the conductor material of the conductor layer in accordance with providing respective amounts of conductor material in the vicinities of the via holes of the plurality thereof, which amounts are in the same proportions relative to the total volume of conductor material as the proportions of the respective, individual volumes of the via holes relatively to the total volume the plurality of via holes.

22. A method as recited in claim 21, wherein the conductor layer is formed in a uniform thickness and the step of proportioning is performed by selectively defining the periphery of the layer of conductive material in respective peripheral portions corresponding to the vicinities of the plurality of via holes.

23. A method as recited in claim 22, further comprising providing via holes of common, respective individual volumes.

24. A method as recited in claim 22, further comprising providing via holes of at least first and second, different, respective individual volumes.

25. A conductive plug forming method for forming conductive plugs in via holes of an insulating layer having a main surface, comprising the steps of:
providing an insulator layer having a plurality of adjacent via holes extending thereinto from said main surface, each two adjacent via holes being separated relatively to each other by a respective, intervening portion of said main surface, said plurality of adjacent via holes comprising at least first and second, said adjacent via holes having respective adjacent edge portions and respective first and second width dimensions in a first direction transverse to said respective, adjacent edge portions and respective, at least first and second volume, said respective, adjacent edge portions being spaced apart in said first direction by a predetermined distance in the range of from a minimum distance approximately equal to, to a maximum distance approximately twice that of, one of said first and second width dimensions;
forming a conductor layer on the main surface of the insulator layer, only in the vicinity of said plurality of adjacent via holes including each said intervening portion, the periphery of said conductor layer defining a boundary encompassing therewith said plurality of adjacent via holes; and
melting the conductor layer by irradiating said conductor layer with an energy beam, the conductor layer having a predetermined volume of conductor material within said boundary relative to the total volume of said plurality of adjacent via holes such that, when melted, the predetermined volume of conductor material within said boundary thereof and in the vicinity of said plurality of adjacent via holes flows in its entirety from said main surface of said insulator layer, toward and into said plurality of adjacent via holes within said boundary, and forms respective plugs in said plurality of via holes and none of said conductor material of said conductor layer remains on said main surface.

26. A conductive plug forming method comprising the steps of:
forming a conductor layer only in the vicinity of a plurality of via holes which are formed in a substrate layer;
irradiating an energy beam onto the conductor layer to melt the conductor layer and so that the melted conductor material of the conductor layer flows into and completely fills the via holes, thereby forming a conductive plug in each of the via holes;
said plurality of via holes including first and second via holes having respective, relatively smaller and larger sizes but the same depth and, correspondingly, relatively smaller and larger volumes; and
said step of forming said conductor layer further comprises forming the conductor layer in a predetermined shape which includes therein the first and second via holes and such that the volume of the portion of the conductor layer surrounding the first via hole is smaller than the volume of the portion of the conductor layer surrounding the second via hole.

27. A conductive plug forming method comprising the steps of:

forming a conductor layer only in the vicinity of a plurality of via holes which are formed in an insulator layer and a reflection layer which is formed on the insulator layer, said insulator layer being made of a material selected from the group consisting of phospho-silicate glass (PSG) and silicon dioxide ($SiO_2$), said reflection layer being made of a material selected from the group consisting of iridium (Ir) and rhodium (Rh), and the conductor layer being made of aluminum-silicon (Al-Si); and irradiating a pulse laser energy beam onto the conductor layer thereby to melt the conductor layer and so that the melted conductor of the conductor layer completely fills the via holes and forms a conductive plug in each of the via holes, said insulator layer being substantially transparent with respect to the energy beam, and said reflection layer being made of a material having a reflectivity greater than that of the insulator layer.

28. The conductive plug forming method as claimed in claim 27, wherein the insulator layer is formed on an interconnection layer and said interconnection layer is made of aluminium (Al).

* * * * *

UNITED STATES PATENT AND TRADEMARK OFFICE
CERTIFICATE OF CORRECTION

PATENT NO. : 5,110,759
DATED : May 5, 1992
INVENTOR(S) : Ryoichi MUKAI

It is certified that error appears in the above-identified patent and that said Letters Patent is hereby corrected as shown below:

Col. 1, line 23, change "interconnection" to --interconnections--;
line 32, delete ",".

Col. 2, line 1, delete ",";
line 50, after "layer to" insert --melt--.

Col. 9, line 9, change "said" to --and--.

Signed and Sealed this

Nineteenth Day of April, 1994

Attest:

BRUCE LEHMAN

Attesting Officer  Commissioner of Patents and Trademarks

UNITED STATES PATENT AND TRADEMARK OFFICE
CERTIFICATE OF CORRECTION

PATENT NO. : 5,110,759
DATED : May 5, 1992
INVENTOR(S) : Ryoichi MUKAI

It is certified that error appears in the above-indentified patent and that said Letters Patent is hereby corrected as shown below:

Title Page:

Item [56], under "FOREIGN PATENT DOCUMENTS", please add:

```
58-115835    7/1983    Japan
63-204630    8/1988    Japan
```

Signed and Sealed this

Thirteenth Day of December, 1994

Attest:

BRUCE LEHMAN

Attesting Officer

Commissioner of Patents and Trademarks